March 23, 1965 R. A. LOGAN 3,174,882

TUNNEL DIODE

Filed Feb. 2, 1961

INVENTOR
R. A. LOGAN

BY Arthur J. Torsiglieri

ATTORNEY 3,174,882
Patented Mar. 23, 1965

3,174,882
TUNNEL DIODE

Ralph A. Logan, Morristown, N.J., assignor to Bell Telephone Laboratories, Incorporated, New York, N.Y., a corporation of New York Filed Feb. 2, 1961, Ser. No. 86,735
5 Claims. (Cl. 148—1.5)

This invention relates to Esaki or tunnel diodes and to a process for their manufacture.

Esaki or tunnel diodes are now well known. Such a diode comprises a semiconductive element including two degenerate zones of opposite conductivity type defining therebetween an abrupt p-n junction, and such a diode is of interest because its voltage-current characteristic includes a negative resistance region for appropriate values of forward bias. As understood by workers in the art, degenerate semiconductive material is material in which the Fermi level, rather than lying in the forbidden energy band gap, lies above the bottom of the conduction band for n-type material and below the top of the valence band for p-type material. Additionally, an "abrupt" junction is one in which the associated space charge layer is sufficiently narrow, typically no more than 100 Angstroms thick, such that sufficient quantum mechanical tunneling therethrough can occur for a useful negative resistance effect.

For certain specialized applications it is advantageous to achieve a voltage-current characteristic which is characterized by two discrete negative resistance regions. In the past, this has been achieved by connecting two tunnel diodes of different characteristics in series-aiding relation or by including in a single wafer a pair of rectifying junctions of different characteristics suitably interconnected.

This invention is a tunnel diode including only a single junction which exhibits the desired two discrete negative resistance regions in its voltage-current characteristic and to a process for its manufacture.

In particular, the desired characteristic is achieved in a tunnel diode including a single abrupt junction separating a pair of degenerate zones, of which the p-type zone includes an appropriate number of defects of appropriate energy. The defect energy levels are introduced by first bombarding the diode with high energy particles, thereby creating lattice defects and thereafter annealing the diode to pair some of the defects with donor atoms.

The invention will be better understood from the following more detailed description, taken in conjunction with the accompanying drawing, in which.

Figure 1:
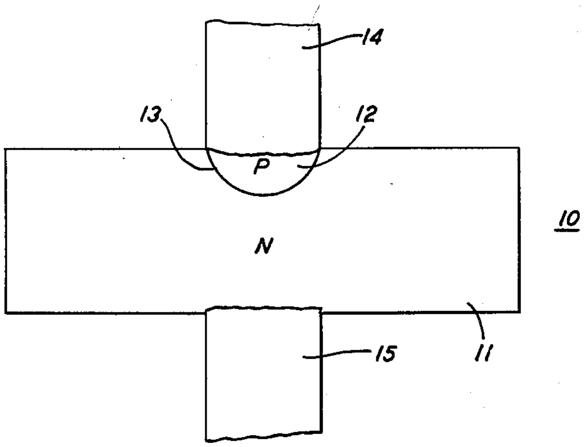
FIG. 1 shows schematically an illustrative embodiment of the invention.

With reference now to the drawing, the diode 10 shown in FIG. 1 depicts an element which was built and found to exhibit the desired characteristic. In this particular embodiment, the semiconductive element or wafer 11 was monocrystalline silicon and had dimensions of fifty mils square and twenty mils thick.

The diode was formed by alloying an aluminum wire doped with one percent boron into an arsenic-doped wafer. In particular, the arsenic concentration in the wafer was initially about $5\times10^{19}$ atoms per cubic centimeter, the wire had a diameter of three mils and the alloying was done by positioning the wafer on a strip heater, contacting it with the wire, and heating the assembly for about five seconds at about 600 degrees centigrade in a helium atmosphere. An ohmic contact had earlier been made to the wafer by alloying a gold wire to the wafer in the same way.

The resulting diode as shown includes an n-type zone 11 which constitutes the bulk of the wafer and a p-type zone 12 which is the alloy regrowth portion. Each of zones 11 and 12 is degenerate and the junction 13 is abrupt. The boron-aluminum wire serves as electrode 14 and the gold wire as electrode 15.

Thereafter, the diode was placed in a Van de Graff accelerator and bombarded at room temperature for about nineteen minutes utilizing a 2.57 microampers current of electrons of one million electron-volts energy. The beam of electrons had a diameter of about .3 centimeter, and it is estimated that the bombardment flux of incident electrons was $7\times10^{13}$ electrons/centimeter$^2$/second.

Finally, the diode was annealed by heating in a hydrogen atmosphere in a furnace of low heat capacity so that it took about one minute to go to or from the annealing temperature of about 380 degrees centigrade. The characteristics to be described were achieved during this final heating and observed by periodically interrupting the annealing and making appropriate measurements.

Figure 2:
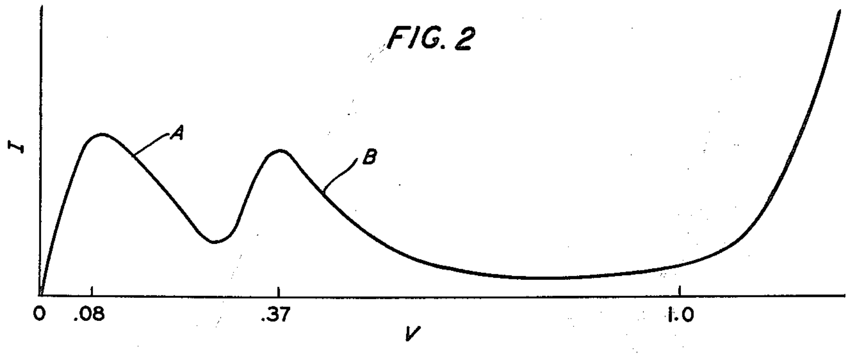
FIG. 2 shows the voltage-current characteristic typical of embodiments of the invention.

FIG. 2 shows the voltage-current characteristic measured for the diode described after annealing for five minutes. For making the measurements a variable voltage source is connected between electrodes 14 and 15 poled to bias the junction 13 in the forward direction. As can be seen, the characteristic includes two discrete negative resistance regions A and B as desired.

Figure 3:
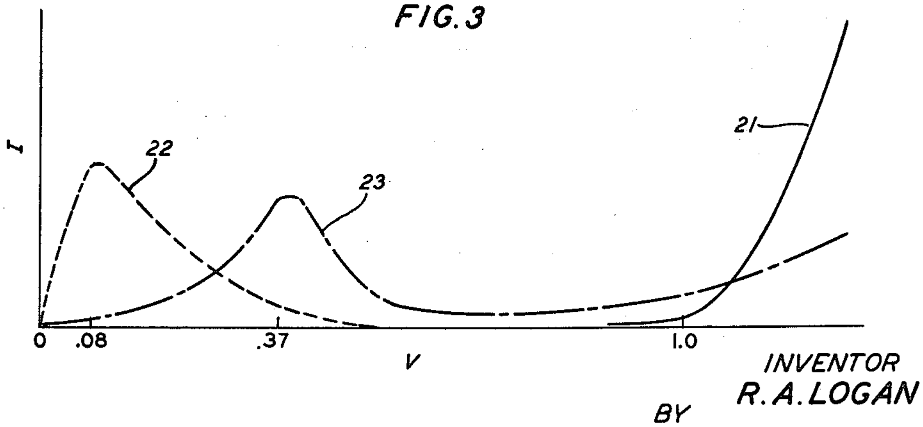
FIG. 3 shows separately the characteristics of the various components which make up the characteristic shown in FIG. 2.

The characteristic observed can be explained as follows:

The total current of a tunnel diode comprises essentially three components. The first component is the minority-carrier injection current associated with the flow of holes and electrons over the potential barrier of the junction under the influence of an applied forward bias. In FIG. 3 this component is shown by the solid line 21. As shown, this component is very low for low values of forward bias but tends to rise exponentially when the voltage exceeds a particular value. For silicon diodes this value is about one volt.

The second component is the current which results from the quantum mechanical tunneling through the potential barrier of the junction of electrons in the conduction band of the material of the n-type region to empty acceptor states of equal energy in the valence band of the material in the p-type region and conversely of holes in the valence band of the material of the p-type region to empty donor states of equal energy in the conduction band of the material of the n-type region. It will be convenient to describe this simply as the tunneling current. This component is shown as the dotted line 22 in FIG. 3. As shown, this component tends to peak at a relatively low value of forward bias voltage. This value is a characteristic of the semiconductive material used. In a silicon device, the peak occurs at about 0.08 volt.

The third component is the current which results from the tunneling of electrons in the conduction band of the material in the n-type region to empty acceptor states of equal energy above the top of the valence band of the material in the p-type region. It will be convenient to designate this as the excess current. This excess current depends on the existence of empty acceptor states in the band gap of the material forming the p-type region.

Acceptor states capable of causing excess current can arise from a variety of sources and typically have a spread of energy levels. Accordingly, excess current typically has been regarded as a nuisance in prior art devices and advantageously has been kept to an insignificant value.

An important characteristic of applicant's invention is the controlled creation of a number of defect energy levels which serve as acceptor states of appropriate energy level for providing the desired voltage-current characteristic. The bombardment and subsequent annealing have this effect. In particular, in the diode described, such processing has resulted in the introduction into the material of the p-type region of a large number of defect energy levels having an energy corresponding to an applied bias of .37 volt as evidenced by the peak in the excess currrent component shown in FIG. 3 by the dot-dash line 23. In particular, the processing described is useful for creating a peak in the excess current at a voltage which is related to the donor atom found in the p-type material. In a silicon diode treated substantially as described in which phosphorus was the donor impurity a peak was reached at .17 volt.

An explanation of the effect of the processing described follows. The bombardment results in the formation of lattice defects many of which serve as acceptor states. However, such acceptor states tend to be of random energy without a heavy concentration at a particular energy level. The annealing results in the pairing of donor atoms in the p-type material with the lattice defects, and the resulting pair serves as a defect or an acceptor state with a specific energy level.

The diode characteristic is determined by the summation of the three component currents. In prior art diodes, in which the excess current is kept insignificant, the characteristic includes only a single negative resistance region resulting from the peak in the tunneling current.

In the diode described, in which the excess current is controlled to provide a peak at .37 volt, the diode characteristic exhibits two negative resistance regions reflecting the distinct peaks in the tunneling current and the excess current.

The shape of the diode characteristic can be controlled by separate adjustment of the heights of the peaks in the tunneling and excess currents.

The height of the peak in the tunneling current is determined both by the width of the space charge layer associated with the junction and the impurity concentrations adjacent the space charge layer. The narrower the layer, the higher is the peak, the higher the impurity concentrations, the higher the peaks.

The height of the excess current peak, as previously explained, is primarily determined by the number of acceptor states of appropriate energy available in the p-type material adjacent the space charge layer. From the previous discussion it should be evident that the number of acceptor states of appropriate energy can be controlled in a variety of ways. The number of donors in the p-type material adjacent the space charge layer, the number of lattice defects introduced by the bombardment and the annealing conditions for pairing donor atoms with lattice defects all provide a measure of control. In particular, it will be evident that annealing for an insufficient time and/or at an insufficient temperature results in the formation of too few of the acceptor states desired. Annealing too long and/or at too high a temperature may, on the other hand, result in annealing the defects created by the bombardment and thereby reduce the formation of acceptor states of desired energy.

Various applications will be evident to a worker in the art for a diode having the characteristic depicted. In particular, such a diode can be useful in a circuit designed to have three stable states.

It will be evident further that the specific embodiment described is merely illustrative of the general principles of the invention and various other designs may be devised without departure therefrom. In particular, other semiconductive materials can be used in conjunction with impurities capable of providing acceptor states or other energy states in the forbidden gap of appropriate energy and in sufficient numbers when processed in accordance with the principles described. Similarly, the desired lattice defects can be introduced in other ways, for example, by bombardment with other particles, for example, protons.

What is claimed is:

1. The process of fabricating a tunnel diode whose current-voltage characteristic exhibits two negative resistance regions comprising the step of introducing into the p-type zone of a tunnel diode exhibiting one negative resistance region a concentration of acceptor states of random energy and treating said p-type zone to produce a sufficient concentration of acceptor states of a particular energy to produce a negative resistance characteristic in the excess current region.

2. The process of fabricating a tunnel diode whose current-voltage characteristic includes two negative resistance regions comprising the steps of bombarding a tunnel diode which exhibits one negative resistance region with a beam of high energy particles to create lattice defects therein and thereafter annealing the diode at a temperature and for a time to create a controlled amount of acceptor states in the p-type zone of the diode for creating a peak and negative resistance characteristic in the excess current of the diode characteristic of the donor impurity in the diode.

3. The process of fabricating a tunnel diode which exhibits two negative resistance regions in its voltage-current characteristic comprising the steps of alloying an aluminum-boron member into an arsenic-doped silicon body for forming an abrupt p-n junction in the body separating two degenerate zones bombarding the body with high energy electrons for introducing lattice defects having a spread of energy levels therein and annealing the body at a temperature and for a time to introduce acceptor states having specific energy levels in the alloy regrowth region whereby the excess current associated with the junction exhibits a peak and a negative resistance characteristic at a voltage characteristic of arsenic.

4. A tunnel diode whose current voltage characteristic includes two negative resistance regions comprising a semiconductive body including an abrupt rectifying p-n junction separating degenerate p-type and n-type zones, the p-type zone being further characterized by concentration of acceptor states for creating a peak and a negative resistance characteristic in the excess current associated with the junction at a voltage characteristic of said acceptor state, said voltage being different from the voltage at which the tunneling current peaks.

5. A tunnel diode in accordance with claim 4 in which the semiconductive body is silicon and the abrupt p-n junction separates a degenerate aluminum-boron alloy regrowth p-type region and an arsenic-doped n-type region.

References Cited by the Examiner

UNITED STATES PATENTS

| | | | |
|---|---|---|---|
| 2,750,541 | 6/56 | Ohl | 148—1.5 X |
| 2,787,564 | 4/57 | Shockley | 148—1.5 |
| 2,840,495 | 6/58 | Treuting | 148—1.5 |
| 2,964,689 | 12/60 | Buschert et al. | 148—1.5 |

OTHER REFERENCES

Esak: "Properties of Heavily-Doped Germanium and Narrow p-n Junctions," Solid State Physics in Electronics and Telecommunications, vol. 1, Semiconductors, Part 1, Academic Press, New York, 1960, pp. 514–523.

Yajima et al.: 'Excess Noise in Narrow Germanium p-n Junction," Journal of the Physical Society of Japan, vol. 13, No. 11, November 1958, pp. 1281–1287.

Sommers: Proceedings of the IRE, July 1959, pp. 1201–1206.

Hunter: Handbook of Semiconductor Electronics, first edition, McGraw-Hill Book Co., Inc., New York, 1956, relied on pages 3–6.

DAVID L. RECK, *Primary Examiner.*

RAY K. WINDHAM, *Examiner.*